June 13, 1961 A. G. SAMUSENKO 2,988,653

TRANSFLUXOR COUNTING CIRCUIT

Filed June 3, 1958 2 Sheets-Sheet 1

INVENTOR.
ANATOL G. SAMUSENKO
BY Morris A. Rabkin
ATTORNEY

June 13, 1961 A. G. SAMUSENKO 2,988,653

TRANSFLUXOR COUNTING CIRCUIT

Filed June 3, 1958 2 Sheets-Sheet 2

INVENTOR.
ANATOL G. SAMUSENKO
BY
Morris A. Rabkin
ATTORNEY

United States Patent Office 2,988,653

Patented June 13, 1961

2,988,653

TRANSFLUXOR COUNTING CIRCUIT

Anatol G. Samusenko, Camden, N.J., assignor to Radio Corporation of America, a corporation of Delaware Filed June 3, 1958, Ser. No. 739,544

15 Claims. (Cl. 307—88.5)

This invention relates to counting circuits, and particularly to circuits generally useful in counting applications.

Counting circuits have wide use in the electronic art. Frequency division and synchronizing systems often use frequency counters. In certain control systems a counter may be used to directly count events. In certain other systems, a storage type counter having a linear capacitor is used. Equal increments of charge are added to the capacitor for successive input signals. One disadvantage of capacitor counters is that the charge varies with time due to the leakage resistance. Because of the leakage resistance, the capacitor storage counters are mainly used in applications where the input signals occur at a uniform rate. Counters of the flip-flop type may be used to store signals occurring at uniform or random rates. However, flip-flop counters are more complex.

Many applications also require a counter whose counting ratio may be varied. The counting rate of capacitor type counters may be varied by changing the capacitor supply voltage. In practice, however, the capacitor type storage counters have a rather limited range of counting ratios. Counters of the flip-flop type require additional circuits and components in addition to those normally used to obtain different counting ratios.

It is an object of the present invention to provide improved counting circuits.

Another object of the present invention is to provide improved counting circuits of the storage type.

A further object of the invention is to provide improved counter circuits of the storage type and which are capable of counting at different counting ratios.

Another object of the invention is to provide an improved counter circuit whose counting ratio can be varied automatically by means of an electric control signal.

According to the present invention, a counting circuit includes a transfluxor comprising a multi-apertured core of rectangular hysteresis loop material having a control winding linked through one aperture thereof and having a pair of other windings linked through another aperture thereof. A pair of electronic devices, such as transistors, are coupled to the pair of windings linked to the core. One transistor responds to the input pulses to be counted to apply a signal to an input winding of the pair. The other transistor provides an output signal. A capacitor coupled to the input winding applies an operating signal to the output transistor. The output transistor applies a signal to the other winding of the pair to reset the core. Depending upon a prior control signal, an output signal is provided after the receipt of a set number of input signals. At this time, the core is also reset to its initial state. A new output signal is produced each time the set number of input signals is received.

The counting ratio can be varied in discrete steps by applying different control signals to the control winding. Once the core is set, the control signals may be permanently removed and thereafter the counting circuit operates at the desired set ratio.

Figure 1:
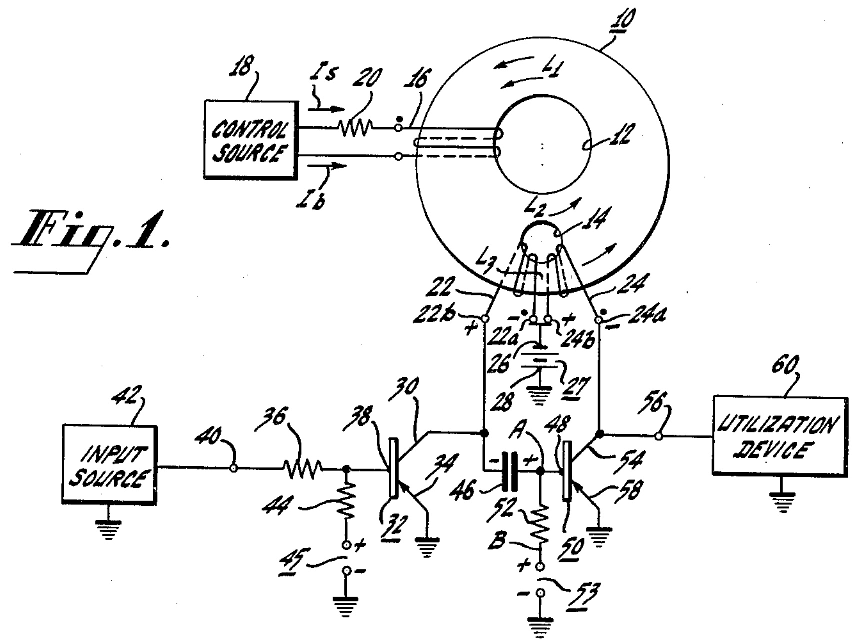
FIG. 1 is a schematic diagram of a counting circuit according to the present invention.

The multi-apertured, transfluxor core 10 of FIG. 1 has a relatively large aperture 12 termed herein a "setting" aperture and a relatively small aperture 14 termed herein an "output" aperture. The two apertures 12 and 14 define three legs, $L_1$, $L_2$ and $L_3$ in the core 10. The wide outside leg $L_1$ between the setting aperture 12 and the periphery of the core 10, has a cross-sectional area at least equal to the sum of the cross-sectional areas of the middle leg $L_2$ and the narrow outside leg $L_3$. A control winding 16 is linked to the core 10 through the setting aperture 12. The terminals of the control winding 16 are connected to a source 18 of control signals. A current limiting resistor 20 may be connected in series between the control source 18 and the control winding 16. A pair of windings including an input winding 22 and a reset winding 24 are each linked to the core 10 through the output aperture 14. The sense of linkage of any winding to the core 10 is indicated in the drawing by the conventional dot notation. The flux orientation produced in the core 10 by a given input signal may be ascertained by using the well known right-hand rule.

The dot terminal **22*a* and the non-dot terminal 24*b* of the windings 22 and 24 are each connected to the negative terminal 26 of a supply source indicated as the battery 27. The positive terminal 28 of the battery 27 is connected to a common point of reference potential, indicated in the drawing by the conventional ground symbol. The non-dot terminal 22*b* of the input winding 22 is connected to the output electrode of the first input device, such as the collector electrode 30 of an input transistor 32. The emitter electrode 34 of the input transistor 32 is connected to ground. A resistance element 36 directly couples the base electrode 38 of the first transistor 32 to an output terminal 40 of an input source 42. A bias resistor 44 connects the base electrode 38 of the first transistor 32 to the positive terminal of a source 45 of reverse bias 45 for the input transistor 32. The negative terminal of the reverse bias source 45** is connected to ground.

The source 42 of input signals is used to apply input signals to the counter circuit. The input source 42 may be any device from which signals to be counted originate. The input signals preferably are uniformly spaced with respect to each other. The input signals, however, may have various waveshapes such as sinewave, square wave, etc.

The collector 30 of the input transistor 32 is A.C. coupled by a coupling capacitor 46 to the base electrode 48 of an output transistor 50. A bias resistor 52 connects the base electrode 48 of the output transistor 50 to the positive terminal of a reverse bias source 53 for the output transistor 50. The negative terminal of the reverse bias source 53 is connected to ground.

The collector electrode 54 of the output transistor 50 is connected to the dot terminal **24*a* of the reset winding 24. The collector electrode 54 of the output transistor 50 is also connected to an output terminal 56. The emitter electrode 58 of the output electrode 50 is connected to the common ground. The counting circuit output terminal 56 is connected to an input terminal of a utilization device 60. The utilization device 60 may be any suitable device responsive to the output signals of the counter circuit. The input source 42 and the utilization device 60** each has another terminal connected to ground.

The multi-apertured core 10 corresponds to the two apertured transfluxor core described by J. A. Rajchman and A. W. Lo in an article entitled "The Transfluxor" published in the March 1956 Proceedings of the I.R.E. Details of the arrangement and operation of transfluxor devices are described in that article. Briefly, a core 10 is made from substantially rectangular hysteresis loop magnetic material and has a blocked state and a plurality of distinct set states. In the blocked state, the flux throughout the core 10 is orientated in the same one sense with reference to the setting aperture 12. The flux in the blocked state is indicated in the drawings by the arrows in the legs $L_1$, $L_2$ and $L_3$. When the core 10 is in the blocked condition, substantially no flux change is produced in the narrow legs $L_2$ and $L_3$ by a current flow into either one of the windings 22 and 24. No flux change is produced because the flux in the narrow legs $L_2$ and $L_3$ is orientated in mutually opposite senses.

In the set state, a portion of the flux in the leg $L_2$ is initially oriented in the same sense as the flux in the leg $L_3$. Now, a current of suitable polarity applied to one of the counter circuit windings 22 and 24 can reverse this portion of flux in the leg $L_2$ and a corresponding portion in the leg $L_3$. Repeated reversals of these portions of flux can be carried out by alternating the polarity of the signals applied to the windings 22 and 24. The portion of flux in the leg $L_2$ may be varied in discrete steps from a minimum value when the transfluxor is in its blocked condition, to a maximum value in which all the flux in the middle leg $L_2$ is oriented in the same sense as the flux in the leg $L_3$. The senses of flux orientation in the legs $L_2$ nad $L_3$ are taken with respect to the output aperture 14.

The core 10 is set to a desired one of the discrete set states by applying a suitable polarity and amplitude control signal to the control winding 16. Once the core 10 is established in a desired state, either blocked, or one of the discrete set states, it remains in that state for an indefinitely long time. The setting of the core 10 at any one time controls the counting ratio of the counter circuit.

Figures 2, 3:
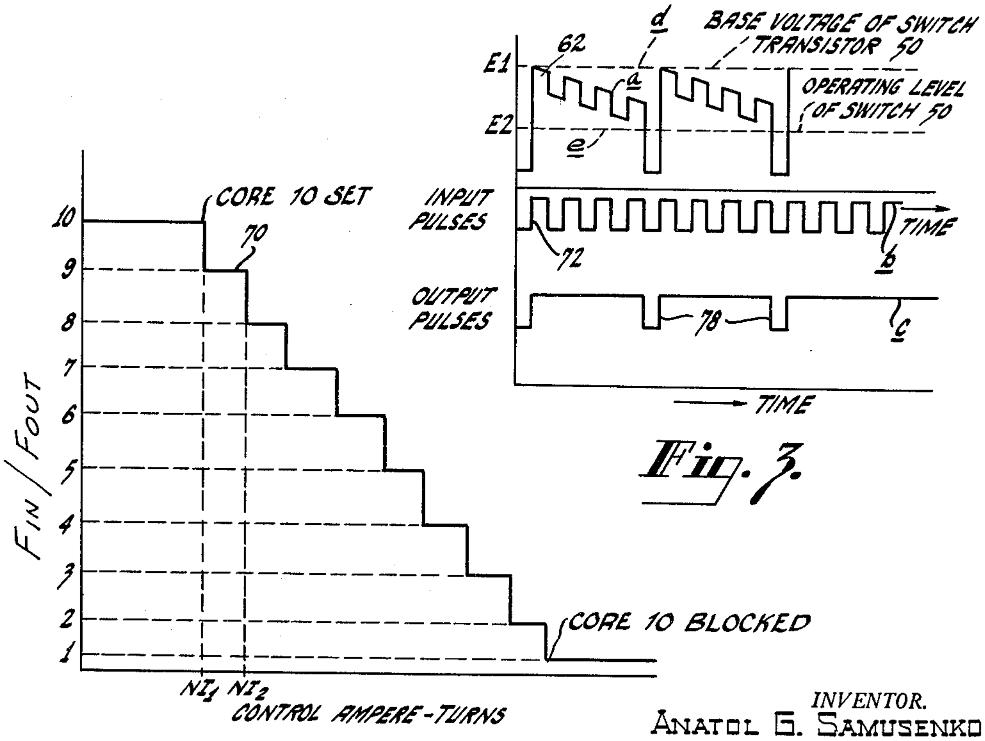
FIG. 2 is a curve showing the variation in counting ratio as a function of control signals applied to the counting circuit of FIG. 1.
FIG. 3 is a timing diagram of waveforms useful in explaining the operation of the counting circuit of FIG. 1.

The curve 70 of FIG. 2 represents a plot of the counting ratio as a function of control signals. The ordinate of the curve 70 of FIG. 2 represents the ratio between the frequency ($F_{IN}$), or repetition rate, of the input signals supplied by the input source 42, and the output frequency ($F_{OUT}$), or repetition rate, of the signals applied to the utilization device 60. The abscissa of the curve 70 is plotted in units of ampere-turns (N1) applied by the control winding 16 to the core 10. The curve 70 was taken by placing the core 10 in its blocked condition and adjusting the source 42 input signal amplitude until a 10:1 ratio was obtained. The core 10 is placed in its blocked state by applying a relatively large current represented by the arrow *Ib* to the control winding 16 to thereby cause a current flow into the non-dot terminal.

Thus, the curve 70 of FIG. 2 corresponds to the flux conditions in the leg $L_3$. A curve similar to the curve 70 can be taken for the flux conditions in the leg $L_2$ corresponding to the different counting ratios. The leg $L_2$ curve would be plotted to the left of the vertical axis of FIG 2. The input signals are applied to the input transistor 32 either during or after the setting operation of the counting circuit. The counting ratio is decreased by applying a setting signal represented by the arrow Is (FIG. 1) to the control winding 16. Successively, lower counting ratios are obtained by applying successively larger amplitude setting signals to the control winding 16. Note that the curve 70 is a step-type function having a range of control currents producing the same counting ratio. For example, control currents producing magnetizing forces between the range NI1 to NI2 cause the counting circuit to operate at a ratio of nine. Whereas control currents producing a slightly larger magnetizing force than the magnetizing force NI2 cause the counting circuit to decrease its counting ratio from nine to eight.

The reason for the step response characteristic is not fully understood. However, it is believed that the magnetizing forces generated by the control signals interact with the magnetizing forces produced by currents flowing in the output windings 22 and 24. Once the counting circuit settles to the desired counting ratio, the control signal may be removed. Thereafter, the counting circuit continues to operate at the set ratio until a new control signal is applied. The control signals may be A.C. (alternating current) or D.C. (direct current) type signals.

The windings 22 and 24 may be linked to the core 10 with the same number of turns as shown, or if desired, the reset winding 22 may have a larger number of turns, say five times as many turns, as the input winding 24.

In operation, assume that the input transistor 32 and the output transistor 50 are cut-off due to the reverse bias applied to their emitter-base diodes. As described hereinafter, each time the output transistor 50 switches, the flux about the output aperture 14 of the core 10 is reset to the initial set condition. This reset operation produces a relatively large flux change about the output aperture 14 which operates to induce a relative large voltage across the input winding 22 to charge the capacitor 46. The capacitor 46, is charged to a value E1 dependent on the initial setting, i.e. the amount of flux available for change about the output aperture 14, of the core 10. The output transistor 50 is maintained in the on condition by the base input current produced by the relatively large flux change in the core 10. As the reset flux change of the core 10 nears completion, the base input current of the output transistor 50 decreases and, due to the regenerative coupling, the output transistor is rapidly driven to cut-off. Thus, the switching of the output transistor 50 between the two conditions, on and off, is a regenerative process but is limited by the amount of flux available for change about the output aperture 14. Note that this amount of available flux corresponds to the set counting ratio. When the reset operation is completed, the capacitor 46 begins to discharge through the resistor 52. The capacitor 46 discharge time is relatively slow with respect to the time interval between the applied input signals as indicated in the waveform 62 of FIG. 3. Application of a train of negative input signals to the base electrode 28 of the input transistor 22 causes the circuit including the input transistor 32, the core 10, the capacitor 46, and the output transistor 50 to operate in a manner somewhat analogous to the operation of a synchronized blocking oscillator. Thus, each input pulse of the train reverses a relatively small portion of the flux available for change about the aperture 14, the *n*th input pulse drives the base of the output transistor 50 below the conduction potential E2 causing the output transistor 50 to conduct in regenerative fashion to reset the core 10. Each succeeding *n*th input pulse from the input source 42 similarly causes the output transistor 50 to conduct producing an output signal across the output terminal 56. Each time the output transistor 50 becomes fully conductive, an output signal is applied to the utilization device 60.

The waveforms of FIG. 3, somewhat idealized, illustrate the operation of the circuit. The upper wave form of line *a* of FIG. 3 represents the waveform 62 taken between the points A and B of FIG. 1. The waveform 62 corresponds to that of a synchronized blocking oscillator. The negative pulses 72 of line *b* of FIG. 3 represent the train of negative input signals from the input source 42. The negative pulses 78 of line *c* of FIG. 3 represent the output pulses applied to the utilization device 60.

In taking the curves of FIG. 3, the counter circuit was set to provide a ratio of four between the input and output pulses. The upper dotted line *d* of FIG. 2 represents the maximum excursion of the switch transistor 50 base voltage. The lower dotted line *e* represents the potential E2 required to bias the output transistor 50 to conduction.

As shown by the waveform 62 of line *a*, each fourth input pulse causes the output transistor 50 to conduct, thereby resetting the circuit to its initial condition.

Figure 4:
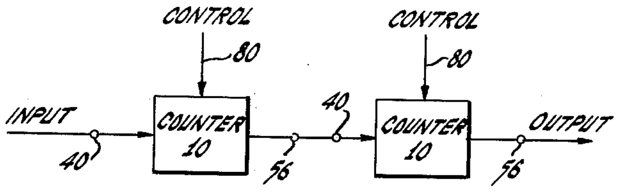
FIG. 4 is a block diagram of another counter circuit according to the invention, having a plurality of the variable ratio counter circuits connected in cascade; and, FIG. 5 is a schematic diagram of another embodiment of a counting circuit according to the invention.

A plurality of counter circuits of FIG. 1 may be connected in cascade as shown in FIG. 4. Separate control inputs indicated by the control leads 80 and 82 may be used for the separate counter circuits 10. The input signals to be counted are applied to the input signal terminal 40 of the first counter 10. The output terminal 56 of the first counter 10 is connected to the input signal terminal 40 of the second counter 10. Output signals appear on the output terminal 56 of the second counter 10 during each "*m*th" input signal to the first counter 10, where "*m*" represents the product $N1 \times N2$ of the set counting ratios N1 and N2 of the two separate counter circuits. The separate control signals may be applied simultaneously, sequentially, or in any order, and may be either A.C., D.C. or pulse type signals.

Figure 5:
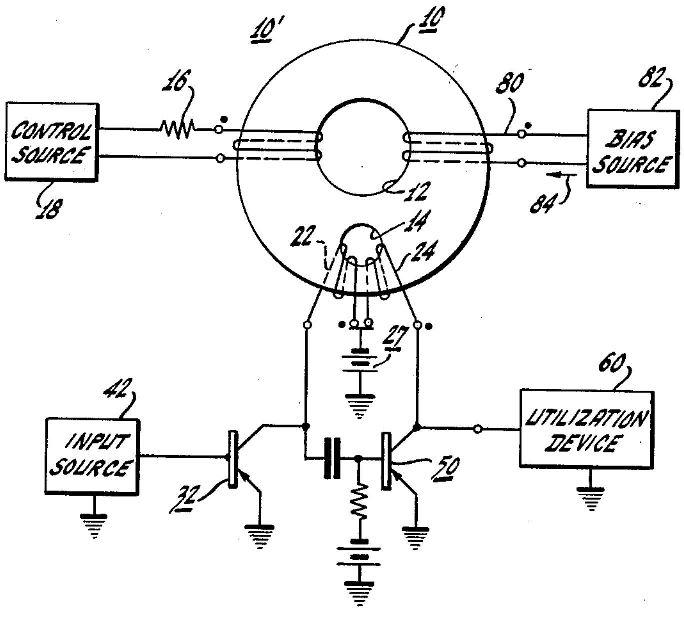

The memory characteristic of the counting circuit, in certain instances, is improved by applying a D.C. bias to the core 10 as shown in the counting system 10' of FIG. 5. The counting circuit 10' of FIG. 5 is similar to the counting circuit 10 of FIG. 1 except that a bias winding 80 is linked to the core 10 through the setting aperture 12. The terminals of the bias winding 80 receive a D.C. bias current from a bias source 82. The bias current flows into the non-dot terminal of the bias winding 80, as indicated by the arrow 84. The bias current tends to oppose any change in the set counting ratio when the control current is removed. Thus, when the bias current is used, the control current need not be as accurately regulated.

There have been described herein improved counter circuits of the storage type which are relatively simple in construction and efficient in operation. These counting circuits may be set to any desired one of a plurality of counting ratios by a momentary control signal. Thereafter, the counting circuits continue to operate at the desired counting ratio. The counting circuits automatically reset to their initial condition each time a desired output signal is obtained.

What is claimed is:

1. A circuit for counting input signals comprising a multi-apertured core of substantially rectangular hysteresis loop material, a pair of windings linked to said core through one aperture thereof, a pair of transistors, means including a capacitor coupling said pair of windings in regenerative fashion to one transistor of said pair, the input signals to be counted being applied to the other transistor of said pair, said other transistor being connected to produce a current flow in one of said pair of windings each time an input signal is received, and a control winding linked to said core through another aperture thereof.

2. A circuit as claimed in claim 1 and further including a bias winding linked to said core through said other aperture.

3. A selectable ratio counter circuit for counting input signals comprising a multi-apertured core of substantially rectangular hysteresis loop material, a pair of transistors each having base, emitter and collector electrodes, a pair of windings having terminals and linked to said core through one aperture thereof, one terminal of a first of said windings being connected to the collector electrode of a first of said transistors, one terminal of the second of said windings being connected to the collector electrode of the second of said transistors, a capacitor coupling the collector electrode of said second transistor to the base electrode of said first transistor, said input signals being applied to the base electrode of said second transistor, and a control winding linked to said core through another aperture thereof for selecting the counting ratio of said counting circuit.

4. A counter circuit as claimed in claim 3 including a bias winding linked to said core through said other aperture.

5. A counter circuit for counting input signals comprising a first and a second counting circuit each as recited in claim 3, the said collector electrode of said first transistor of said first counting circuit being connected to the said base electrode of said second transistor of said second counting circuit, and separate means for applying control signals to said control windings to independently vary the counting ratios of said first and second counter circuits.

6. A counter circuit comprising a plurality of counting circuits each having an input and an output, said counting circuits being connected in cascade by connecting the output of any one counting circuit to the input of the next succeeding counting circuit, said counting circuits each comprising a transfluxor having setting and output apertures, a pair of windings being linked through said setting aperture, a pair of transistors each having base, emitter and collector electrodes, the collector electrode of a first transistor of said pair being connected in series with a first of said windings, each of said transistors being normally non-conductive, said input signals being applied to forward bias a first transistor of said pair to cause current flow in said first winding, means including a capacitor coupling said windings to said second transistor in regenerative fashion, a control winding linked through said setting aperture for controlling the flux conditions in said transfluxor, and each said counter circuit output being connected to the collector electrode of said second transistor whereby each said counter circuit produces an output signal upon conduction of said second transistor, said second transistor conduction being controlled by the said flux conditions in said transfluxor.

7. A circuit for counting input signals comprising a transfluxor having setting and output apertures, a control winding linked through said setting aperture and a pair of windings linked through said output aperture, a pair of electronic conductive devices each having a control and an output electrode, said devices being normally non-conductive, the output electrode of a first device of said pair being connected to a first of said windings, means including a capacitor connecting said windings across said second device of said pair in regenerative fashion, means for applying control signals to said control winding to produce desired flux conditions in said transfluxor, and means for applying input signals to said first device control electrode, each said input signal changing said first device to a conductive condition, said second device becoming conductive upon the application of the "*n*th" one of said input signals, where "*n*" is a function of the said flux conditions of said transfluxor.

8. A circuit for producing an output signal each time "*n*" input signals are received, the number "*n*" being set by a momentary control signal, said circuit comprising a transfluxor having setting and output apertures, said control signal being applied through said setting aperture, an oscillatory circuit having an input and an output, and means includling a pair of windings linked through said output aperture for regeneratively coupling said oscillatory circuit with said transfluxor, said input signals being applied to said oscillatory circuit input, and said output signal being provided at said oscillatory circuit output.

9. A circuit as claimed in claim 8 wherein said oscillatory circuit includes an input and an output transistor, said input transistor receiving said input signals and said output transistor providing said output signal.

10. A circuit as claimed in claim 8, including means for applying a bias signal through said setting aperture.

11. A variable ratio counting circuit comprising a transfluxor having a setting aperture and an output aperture, a pair of windings linked to said transfluxor through said output aperture, first and second transistors each having base, emitter and collector electrodes, said first transistor being connected to produce current flow in said first winding, a capacitor coupling said first transistor collector electrode to said second transistor base electrode, said second transistor being connected to produce current flow in said second winding, said current flows in said first and second windings producing flux changes in opposite senses in said transfluxor, means for applying uniformly spaced input signals to said first transistor base electrode, each of said input signals causing a current flow in said first winding, said second transistor causing a current flow in said second winding upon the application of a given number of said input signals in accordance with the counting ratio of said counting circuit, and means for applying different signals through said setting aperture, each of said different signals operating to vary the counting ratio of said counting circuit.

12. A counting circuit as claimed in claim 11 including means for applying reverse bias between the said base and emitter electrodes of each of said first and second transistors.

13. A circuit for producing an output pulse each time "*n*" input pulses are received, the number "*n*" being controlled by a momentary control signal, said circuit comprising a transfluxor having setting and output apertures, said control signal being applied through said setting aperture, an oscillatory circuit having a pair of windings coupled to said transfluxor through said output aperture and having an input and an output transistor, said input transistor being capacitively coupled to said output transistor and directly coupled to one of said output windings, said input pulses being applied to said input transistor, said pair of output windings being coupled in regenerative fashion to said output transistor, said output pulse being produced by said output transistor.

14. A circuit for receiving input signals at one frequency and producing output signals at any desired one of a plurality of output frequencies, said circuit comprising a transfluxor having a plurality of apertures, means for applying different control signals through one of said plurality of apertures, each said control signal operating to select a different one of said output frequencies, and an oscillatory circuit having an input and an output and coupled to said transfluxor through another of said plurality of apertures, said one frequency signals being applied to said oscillatory circuit input and said output signals being taken from said oscillatory circuit output.

15. A circuit as claimed in claim 14 including means for applying a bias signal through said one aperture.

References Cited in the file of this patent

UNITED STATES PATENTS

| | | |
|---|---|---|
| 2,818,555 | Lo | Dec. 31, 1957 |
| 2,934,750 | Schaefer | Apr. 26, 1960 |
| 2,938,129 | House | May 24, 1960 |